United States Patent
Arkun et al.

(10) Patent No.: US 8,823,055 B2
(45) Date of Patent: *Sep. 2, 2014

(54) REO/ALO/A1N TEMPLATE FOR III-N MATERIAL GROWTH ON SILICON

(71) Applicants: Erdem Arkun, San Carlos, CA (US); Michael Lebby, Apache Junction, AZ (US); Andrew Clark, Los Altos (CA); Rytis Dargis, Fremont, CA (US)

(72) Inventors: Erdem Arkun, San Carlos, CA (US); Michael Lebby, Apache Junction, AZ (US); Andrew Clark, Los Altos (CA); Rytis Dargis, Fremont, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/717,211

(22) Filed: Dec. 17, 2012

(65) Prior Publication Data
US 2014/0167057 A1 Jun. 19, 2014

(51) Int. Cl.
*H01L 31/0336* (2006.01)

(52) U.S. Cl.
USPC ........... 257/189; 257/190; 257/191; 257/192; 257/193; 257/194; 257/195; 257/196; 257/198; 257/199; 257/200

(58) Field of Classification Search
USPC .................................. 257/189–200
See application file for complete search history.

(56) References Cited

U.S. PATENT DOCUMENTS 8,501,635 B1 * 8/2013 Clark et al. ................... 438/779

OTHER PUBLICATIONS

U.S. Appl. No. 13/196,919 (Clark et al.).*

* cited by examiner

*Primary Examiner* — Samuel Gebremariam

(57) ABSTRACT

A method of forming a template on a silicon substrate includes providing a single crystal silicon substrate. The method further includes epitaxially depositing a layer of rare earth oxide on the surface of the silicon substrate. The rare earth oxide being substantially crystal lattice matched to the surface of the silicon substrate. The method further includes forming an aluminum oxide layer on the rare earth oxide, the aluminum oxide being substantially crystal lattice matched to the surface of the rare earth oxide and epitaxially depositing a layer of aluminum nitride (AlN) on the aluminum oxide layer substantially crystal lattice matched to the surface of the aluminum oxide.

10 Claims, 3 Drawing Sheets

REO/ALO/AlN TEMPLATE FOR III-N MATERIAL GROWTH ON SILICON

FIELD OF THE INVENTION

This invention relates in general to the formation of a template for the growth of GaN on a silicon substrate and more specifically to the formation of a REO/aluminum oxide/aluminum nitride template.

BACKGROUND OF THE INVENTION

In the semiconductor industry, it is known that growing a III-N material, such as GaN, on a silicon substrate is difficult due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. It is also known that during much of the growth process there must ideally be no exposed silicon surface due to detrimental reaction between silicon and the various MBE process gasses, i.e. $N_2$ plasma, $NH_3$ and metallic Ga. Also in the case where other growth processes are used, such as MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors).

It would be highly advantageous, therefore, to remedy the foregoing and other deficiencies inherent in the prior art.

Accordingly, it is an object of the present invention to provide new and improved methods for the formation of a REO/aluminum oxide/aluminum nitride template on a silicon substrate.

It is another object of the present invention to provide new and improved methods for the formation of a template that includes eliminating or greatly reducing the problem of possible damage to the silicon substrate with process gasses.

It is another object of the present invention to provide a new and improved REO/aluminum oxide/aluminum nitride template on a silicon substrate.

It is another object of the present invention to provide new and improved LED and/or HEMT structures on a template on a silicon substrate.

SUMMARY OF THE INVENTION

Briefly, the desired objects and aspects of the instant invention are also realized in accordance with a specific crystal lattice matched template on a single crystal silicon substrate. The template includes a layer of rare earth oxide epitaxially deposited on the silicon substrate and an aluminum oxide layer epitaxially deposited on the surface of the rare earth oxide. The aluminum oxide is substantially crystal lattice matched to the surface of the rare earth oxide. A layer of aluminum nitride (AlN) is epitaxially grown on the aluminum oxide layer and substantially crystal lattice matched to the surface of the aluminum oxide layer. III-N materials can then be epitaxially grown on the aluminum oxide layer and formed into devices such as LEDs and HEMTs.

The desired objects and aspects of the instant invention are further achieved in accordance with a preferred method of forming a template on a silicon substrate including a step of providing a single crystal silicon substrate. The method further includes epitaxially depositing a layer of rare earth oxide on the surface of the silicon substrate, the rare earth oxide being substantially crystal lattice matched to the surface of the silicon substrate. The method further includes epitaxially depositing an aluminum oxide layer on the surface of the rare earth oxide layer, the aluminum oxide being substantially crystal lattice matched to the surface of the rare earth oxide, and epitaxially depositing a layer of aluminum nitride (AlN) on the aluminum oxide layer substantially crystal lattice matched to the surface of the aluminum nitride.

The method further includes a step of epitaxially depositing a layer of III-N material on the layer of aluminum nitride. Generally, the step of epitaxially depositing a layer of III-N material includes growing an LED structure and/or an HEMT structure on the layer of aluminum nitride.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
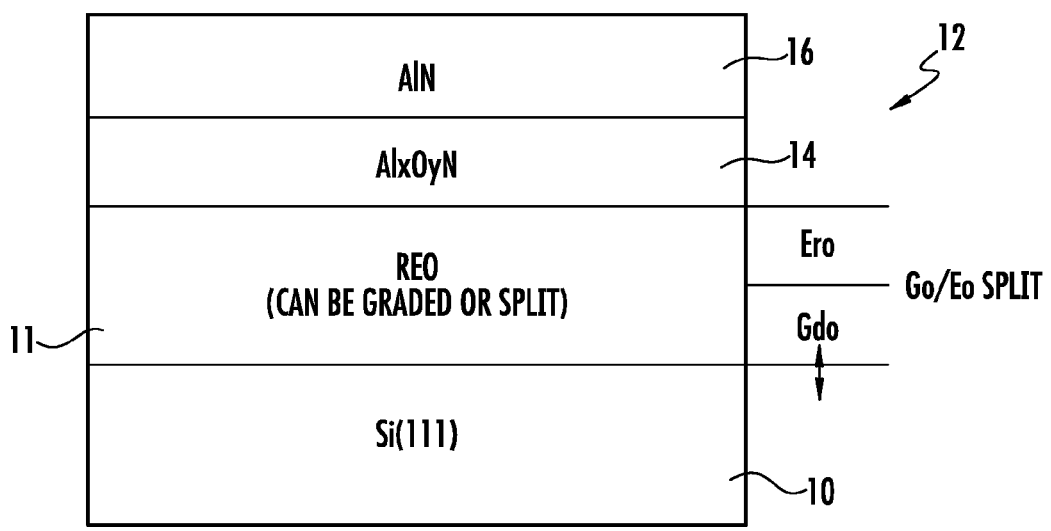
FIG. 1 is a simplified layer diagram of a template on a silicon substrate, in accordance with the present invention.

Turning to FIG. 1, a simplified layer diagram is illustrated representing several steps in a process of forming a template 12 on a silicon substrate 10, in accordance with the present invention. It will be understood that substrate 10 is or may be a standard well known single crystal wafer or portion thereof generally known and used in the semiconductor industry. Single crystal substrates, it will be understood, are not limited to any specific crystal orientation but could include (111) silicon, (110) silicon, (100) silicon or any other orientation or variation known and used in the art. The Si (100) and (111) substrates could also include various miscuts with nominal value between 0 and 10° in any direction. In the present invention a (111) silicon single crystal substrate is preferred because of the simplicity of further epitaxial growth.

A layer 11 of rare earth oxide (REO) is epitaxially grown on silicon substrate 10. Various rare earth oxides have a crystal lattice spacing that can be matched to silicon with very little strain. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. Further, the crystal lattice spacing of REO layer 11 can be varied by varying the composition of the constituents, which allows for strain engineering of the silicon wafers. Generally, the REO material closest to or adjacent silicon substrate 10 will have a crystal spacing closest to the crystal spacing of silicon while REO materials adjacent the opposite side of layer 11 will have a crystal spacing closer to the crystal spacing of materials grown on the surface. Strain engineering mitigates the stresses formed during growth of III-N materials on these substrates.

In a typical example, layer 11 includes $Gd_2O_3$ epitaxially grown on silicon substrate 10 with $Er_2O_3$ epitaxially grown adjacent the opposite (upper) side. The REO materials can be grown in a graded fashion bridging the two compositions or split to have an abrupt change in the composition and/or constituents of layer 11. Also, while two constituents are used in this example other and/or additional rare earth oxides can be included in layer 11.

A layer 14 of aluminum oxide is grown on the surface of REO layer 11. Aluminum oxide layer 14 is grown epitaxially and is mostly single crystal material substantially crystal lattice matched to silicon substrate 10. It will be understood that $Al_2O_3$ is the normal proportion required (stoichiometric) but non-stoichiometric compounds (e.g. $Al_{2-x}O_{3-y}$) may be used in specific applications. Also, aluminum oxide layer 14 may include aluminum oxynitride ($Al_xO_yN$), which is intended to come within the definition of "aluminum oxide" for purposes of this invention.

It should be noted that REO materials and aluminum oxide are impervious to MBE process gasses, i.e. $N_2$ plasma, $NH_3$ and metallic Ga, which is the preferred growth process in this invention. Also, in the event that other growth processes are used, such as the MOCVD process, the aluminum oxide is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors). Thus silicon substrate 10 is protected from damage caused by generally all growth process gasses by both REO layer 11 and aluminum oxide layer 14. Preferably, aluminum oxide layer 14 is a few nanometers (nm) thick but for certain applications thicker or thinner films can be grown. Also, aluminum oxide layer 14 can be formed with a single continuous composition or it can be graded, in linear, stepwise or any similar schemes.

An aluminum nitride (AlN) layer 16 is epitaxially grown on aluminum oxide layer 14 preferably by an MBE process. The combination of aluminum oxide layer 14 and aluminum nitride layer 16 results in a base for the further growth of III-N materials. REO layer 11, aluminum oxide layer 14, and aluminum nitride layer 16 form template 12 which substantially crystal lattice matches the III-N materials to the silicon substrate and greatly reduces any thermal mismatch. Also, template 12 imparts chemical stability to the process due to the nature of the materials.

Figure 2:
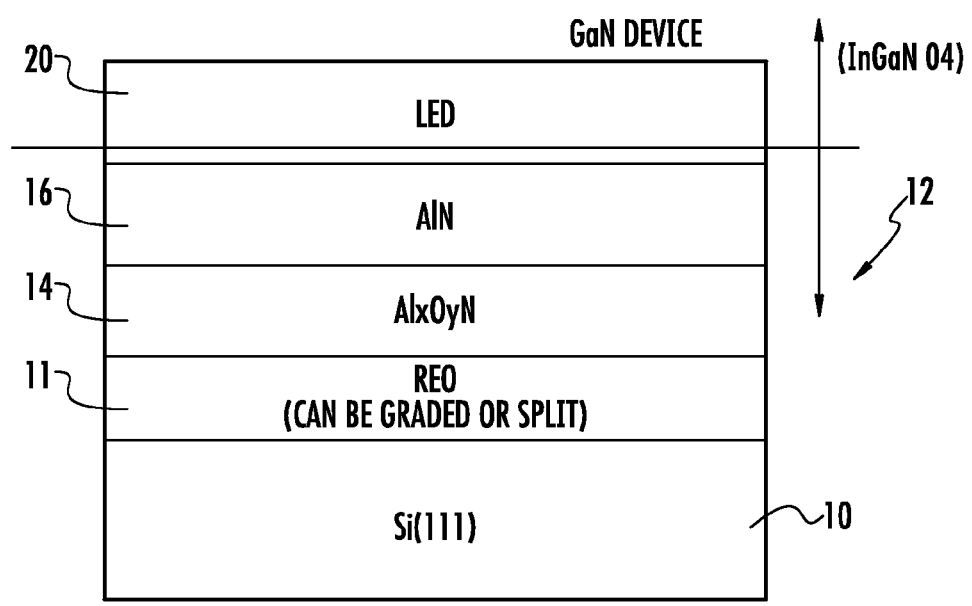
FIG. 2 is a simplified layer diagram of the template of FIG. 1 with an LED structure formed thereon.

Turning to FIG. 2, template 12 is illustrated with a III-N LED structure 20 formed thereon. Structure 20 is illustrated as a single layer for convenience but it should be understood that III-N LED structure 20 includes the growth of one or more typical layers, including for example, i-GaN, n-GaN, active layers such as InGaN/GaN, electron blocking layers, p-GaN, and other inter-layers used in the formation and performance of LED (especially photonic LED) devices.

Figure 3:
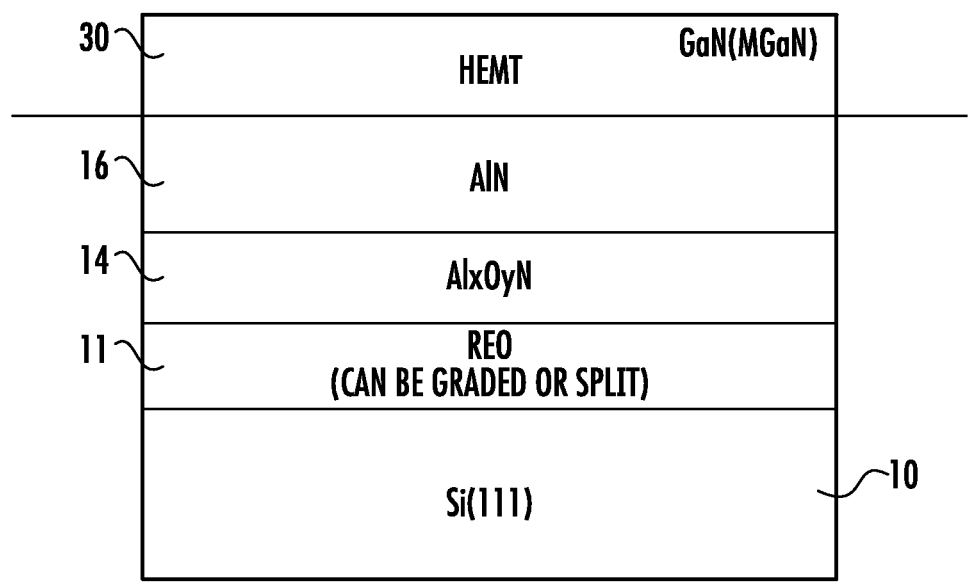
FIG. 3 is a simplified layer diagram of the template of FIG. 1 with an HEMT structure formed thereon.

Turning to FIG. 3, template 12 is illustrated with a HEMT structure 30 formed thereon. Structure 30 is illustrated as a single layer for convenience but it should be understood that HEMT structure 30 includes the growth of one or more typical layers, including for example, i-GaN, AlN, AlGaN, GaN, and other inter-layers used in the formation and performance of HEMT devices.

Thus, new and improved methods for the formation of a REO/aluminum oxide/aluminum nitride template on a silicon substrate are disclosed. The new and improved methods for the formation of the template include eliminating or greatly reducing the problem of possibly damaging the silicon substrate with process gasses. The invention also includes a new and improved REO/aluminum oxide/aluminum nitride template on a silicon substrate with strain engineering to mitigate stresses formed during growth of III-N materials. Because of the strain engineering, new and improved LED and/or HEMT structures can be substantially lattice matched and thermally matched by the new template on a silicon substrate.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A III-N template on a silicon substrate comprising:
   a single crystal silicon substrate;
   a single crystal rare earth oxide layer positioned on the silicon substrate, the rare earth oxide being substantially crystal lattice matched to the surface of the silicon substrate;
   an aluminum oxide layer positioned on the surface of the rare earth oxide layer, the aluminum oxide being substantially crystal lattice matched to the surface of the rare earth oxide layer; and
   a layer of aluminum nitride (AlN) positioned on the surface of the aluminum oxide layer and substantially crystal lattice matched to the surface of the aluminum oxide layer.

2. The III-N template on a silicon substrate as claimed in claim 1 wherein the single crystal layer of rare earth oxide includes a composition including multiple rare earth oxides one of graded to bridge the multiple rare earth oxides or stepped to have an abrupt change in the rare earth oxides.

3. The III-N template on a silicon substrate as claimed in claim 2 wherein the composition including multiple rare earth oxides includes a first rare earth oxide adjacent the silicon substrate having a crystal lattice spacing substantially matching a double lattice spacing of silicon and a second rare earth oxide adjacent the aluminum oxide layer having a crystal lattice spacing substantially matching a crystal lattice spacing of the aluminum oxide layer.

4. The III-N template on a silicon substrate as claimed in claim 3 wherein the first rare earth oxide includes $Gd_2O_3$.

5. The III-N template on a silicon substrate as claimed in claim 3 wherein the second rare earth oxide includes $Er_2O_3$.

6. The III-N template on a silicon substrate as claimed in claim 1 further including a layer of III-N material positioned on the layer of aluminum nitride and substantially crystal lattice matched to the surface of the aluminum nitride.

7. The III-N template on a silicon substrate as claimed in claim 6 wherein the layer of III-N material includes one of an LED structure and an HEMT structure.

8. The III-N template on a silicon substrate as claimed in claim 7 wherein the LED structure includes at least one layer of i-GaN, n-GaN, an active layer, an electron blocking layer, or p-GaN.

9. The III-N template on a silicon substrate as claimed in claim 7 wherein the HEMT structure includes at least one layer of i-GaN, AlN, AlGaN, or GaN.

10. An III-N structure on a silicon substrate comprising:
    a single crystal silicon substrate;
    a single crystal rare earth oxide layer positioned on the silicon substrate, the rare earth oxide being substantially crystal lattice matched to the surface of the silicon substrate;
    an aluminum oxide layer positioned on the surface of the rare earth oxide layer, the aluminum oxide being substantially crystal lattice matched to the surface of the rare earth oxide layer;
    a layer of aluminum nitride (AlN) positioned on the surface of the aluminum oxide layer and substantially crystal lattice matched to the surface of the aluminum oxide layer; and one of a III-N LED structure and a III-N HEMT structure positioned on the layer of aluminum oxide, the one of the III-N LED structure and the III-N HEMT structure including at least one III-N layer substantially crystal lattice matched to the surface of the aluminum nitride layer.

* * * * *